(12) United States Patent
Nie et al.

(10) Patent No.: US 11,875,857 B2
(45) Date of Patent: Jan. 16, 2024

(54) METHOD FOR PROGRAMMING MEMORY

(71) Applicant: CHINA FLASH CO., LTD., Shanghai (CN)

(72) Inventors: Hong Nie, Shanghai (CN); Jingwei Chen, Shanghai (CN)

(73) Assignee: CHINA FLASH CO., LTD., Shanghai (CN)

( * ) Notice: Subject to any disclaimer, the term of this patent is extended or adjusted under 35 U.S.C. 154(b) by 176 days.

(21) Appl. No.: 17/576,985

(22) Filed: Jan. 16, 2022

(65) Prior Publication Data

US 2022/0139463 A1 May 5, 2022

Related U.S. Application Data

(63) Continuation-in-part of application No. 17/458,186, filed on Aug. 26, 2021, now Pat. No. 11,468,951.

(30) Foreign Application Priority Data

Sep. 11, 2020 (CN) .......................... 202010954474.5

(51) Int. Cl.
*G11C 16/04* (2006.01)
*G11C 16/14* (2006.01)
*H10B 41/30* (2023.01)
*H01L 29/788* (2006.01)
*G11C 16/10* (2006.01)

(52) U.S. Cl.
CPC .......... *G11C 16/14* (2013.01); *G11C 16/0408* (2013.01); *H10B 41/30* (2023.02); *G11C 16/0483* (2013.01); *G11C 16/10* (2013.01); *H01L 29/7881* (2013.01)

(58) Field of Classification Search
CPC .................................................. G11C 16/0425
See application file for complete search history.

(56) References Cited

U.S. PATENT DOCUMENTS

2009/0168531 A1* 7/2009 Shirota .............. G11C 16/3418
365/185.15

* cited by examiner

*Primary Examiner* — Jason Lappas
(74) *Attorney, Agent, or Firm* — Global IP Services; Tianhua Gu

(57) ABSTRACT

A method for programming a memory. The method includes providing a memory structure with a floating gate, and grounding a source of the memory structure; applying voltages to a drain and a bulk, forming an electric field, generating electron-hole pairs, and generating primary electrons, wherein the voltage applied to the bulk is lower than the voltage applied to the drain; making holes accelerate downward under the action of the electric field and collide with the bulk in the memory structure within a predetermined time to generate secondary electrons; applying voltages to a gate and the bulk respectively, where the voltage applied to the bulk is lower than the voltage applied to the gate, to enable the secondary electrons to generate tertiary electrons under the action of an electric field in a vertical direction, and the tertiary electrons are injected into the floating gate to complete a programming operation.

8 Claims, 4 Drawing Sheets

METHOD FOR PROGRAMMING MEMORY

CROSS REFERENCE TO RELATED APPLICATION

This application is a continuation-in-part application of U.S. Ser. No. 17/458,186 filed on Aug. 26, 2021, which claims the priority of CN 202010954474.5 filed on Sep. 11, 2020, both applications are incorporated herewith by reference.

FIELD OF TECHNOLOGY

The present disclosure generally relates to the field of memories, and in particular, to a method for programming a memory.

BACKGROUND

Non-volatile memories (NVMs) are applied widely in semiconductor devices. A characteristic of an NVM is that it can save stored data even after it is powered off. The earliest NVM is erasable programmable read-only memory (EPROM). EPROM uses hot carrier injection (HCI) for programming and uses ultraviolet (UV) light for erasure. However, such devices require quartz glass for UV light erasure, resulting in high costs.

To reduce manufacturing costs, electrically erasable programmable read-only memory (EEPROM) utilizing the Fowler-Nordheim (FN) Tunneling effect to perform electrical erasure was invented. In EEPROM, when electrons are injected and stored in a floating gate, it indicates that information "0" is stored; when electrons are erased from the floating gate, it indicates that information "1" is stored. EEPROM requires lower costs than EPROM, but the programming and erasure speed of EEPROM is also lower.

To increase the read speed, the circuit design of EEPROM devices was further improved, so that programming and erasure can be performed on multiple memory cells at the same time. This kind of improved EEPROM is what now commonly known as the Flash EEPROM (or Flash for short)

The most classic flash memory is EEPROM with tunnel oxide (ETOX), which uses HCI for programming. Because hot electrons generated through HCI are injected based on the Lucky Electron model, the programming efficiency is relatively low (around 50% in general), and the voltage needs to be increased to improve the programming efficiency, resulting in high power consumption of the flash memory.

To resolve the shortcomings, a flash memory with a 2T structure based on a Fowler-Nordheim tunneling programming method has been invented, which is based on a band-to-band tunneling (BTBT) programming method. The physical method of quantum tunneling has the disadvantage of relatively low read currents for programming. In addition, such programming methods generate relatively severe damage to tunnel oxide layers, which is also a great challenge to the reliability of the flash memory.

Therefore, it is an urgent problem facing those skilled in the art to provide a method for programming a memory that has a high programming efficiency, low power consumption, high read current for programming, and slight damage to the tunnel oxide layer.

SUMMARY

In view of the above disadvantages of the prior art, the present disclosure provide a method for programming a memory to resolve the problems in the prior art such as low programming efficiency, high power consumption, low programming and read currents, and severe damage to tunnel oxide layers.

The present disclosure provides a method for programming a memory, including at least:

S1) providing a memory structure with a floating gate, and grounding a source of the memory structure;

S2) forming an electric field between a drain and a bulk of the memory structure, generating electron-hole pairs, and forming primary electrons, wherein the voltage applied to the bulk is lower than the voltage applied to the drain;

S3) making holes accelerate downward under the action of the electric field and collide with the bulk in the memory structure within a predetermined time to generate secondary electrons; and S4) forming a vertical electric field between a gate and the bulk of the memory structure, wherein the voltage applied to the bulk is lower than the voltage applied to the gate, to enable the secondary electrons to further collide with the electron-hole pairs under the action of the vertical electric field to generate tertiary electrons, and the secondary electrons and the tertiary electrons are superimposed and injected into the floating gate of the memory structure to complete programming.

Optionally, the memory structure comprises an electrically erasable programmable read-only memory with tunnel oxide (ETOX) structure, a 1.5T structure, a 2T structure, or an EEPROM structure.

Optionally, in step 2), the difference between the voltage applied to the drain and the voltage applied to the bulk is not less than 4 V.

Optionally, in step 3), the predetermined time is between 10 ns and 100 ns.

Optionally, in step 4), the difference between the voltage applied to the gate and the voltage applied to the bulk is not less than 7 V.

Further optionally, before step 1), the method further comprises a step of pre-erasing the memory structure to remove residual charges in the floating gate.

Further optionally, a method of the pre-erasing comprises: applying voltages to the gate and the bulk of the memory structure respectively, wherein the voltage applied to the bulk is higher than the voltage applied to the gate.

Further optionally, the difference between the voltage applied to the gate and the voltage applied to the bulk is not less than 10 V.

As described above, the method for programming a memory of the present disclosure has the following beneficial effects:

In the method for programming a memory according to the present disclosure, by improving and optimizing the operations of programming voltage, tertiary electron excitation is triggered to perform programming, so that the programming efficiency of the memory can be improved, power consumption can be reduced, the read current for programming can be increased, and the device's tunnel oxide layer will only be subject to minor damage.

REFERENCE NUMERALS

Figure 1:
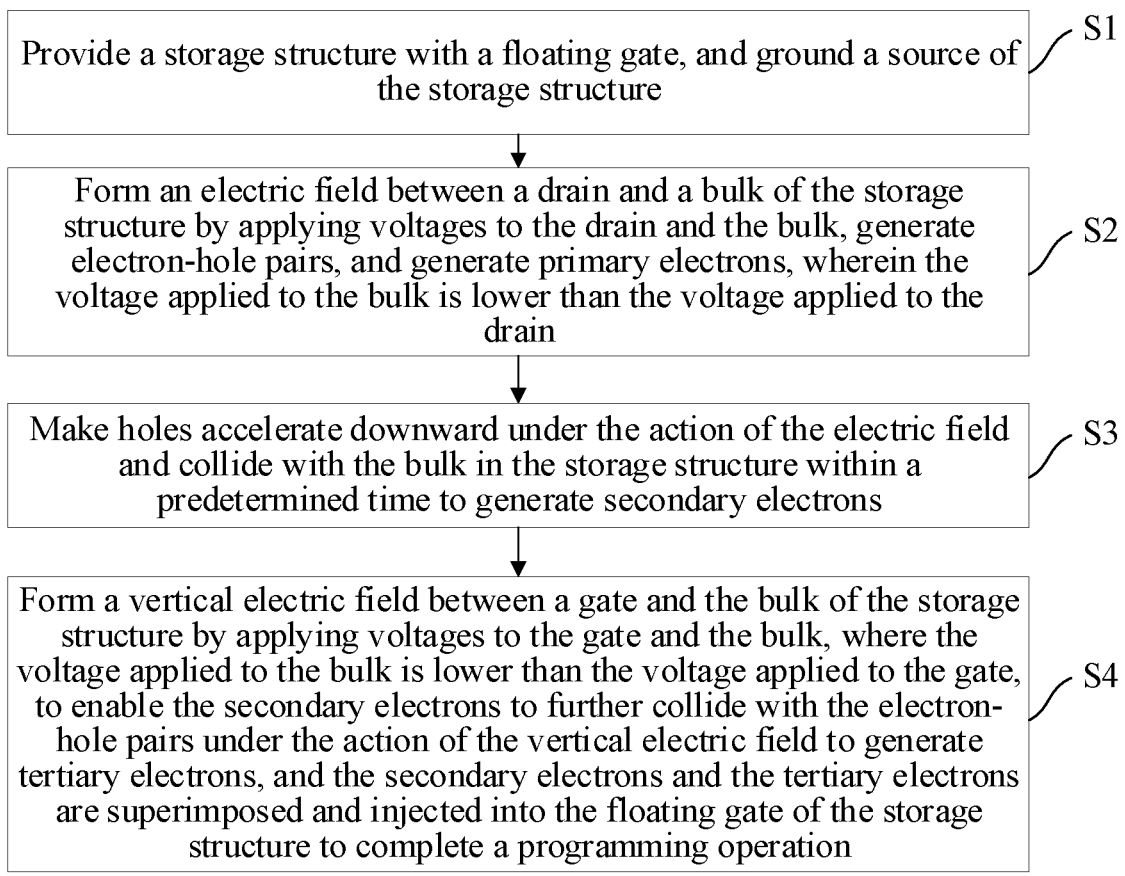
FIG. 1 is a schematic flowchart illustrating a method for programming a memory of the present disclosure.

1 Bulk region
2 Source region
3 Drain region
4 Tunnel oxide layer
5 Floating gate
6 Dielectric oxide layer
7 Control gate

DETAILED DESCRIPTION

The implementations of the present disclosure are described below through specific examples. Those skilled in the art can easily understand the other advantages and effects of the present disclosure from the content disclosed in this specification. The present disclosure may also be implemented or applied through other different specific implementations. Various details in this specification may also be modified or changed based on different viewpoints and applications without departing from the spirit of the present disclosure.

Reference is made to FIG. 1 to FIG. 7. It should be noted that, the drawings provided in this embodiment only exemplify the basic idea of the present disclosure. Therefore, only the components related to the present disclosure are shown in the drawings, and are not drawn according to the quantity, shape, and size of the components during actual implementation. During actual implementation, the type, quantity, and proportion of the components may be changed, and the layout of the components may be more complicated.

As shown in FIG. 1, the present disclosure provides a method for programming a memory. The method for programming a memory comprises the following steps:

1) Provide a memory structure with a floating gate, and ground a source of the memory structure.

Figure 2:
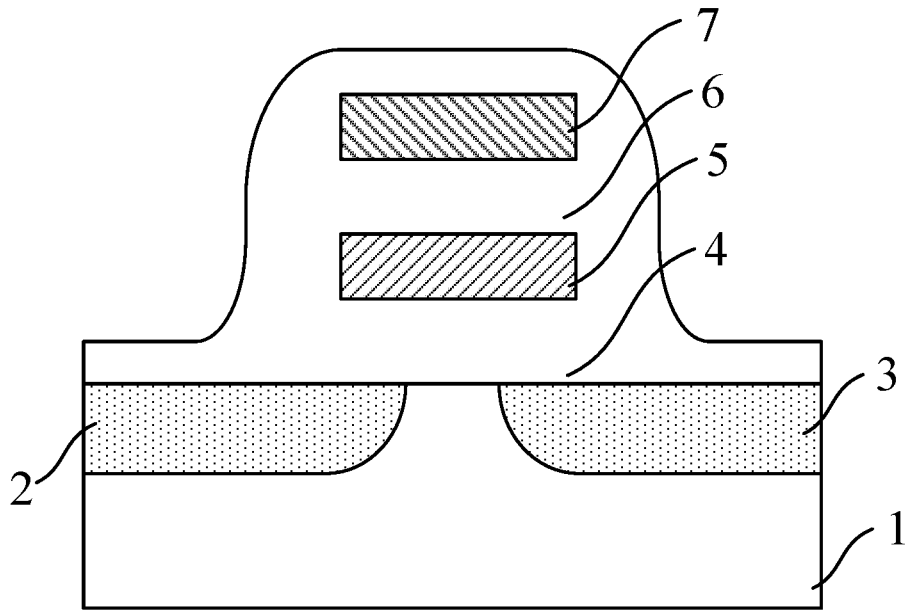
FIG. 2 is a schematic diagram of a flash memory with an ETOX structure.

Specifically, a memory structure is first provided. The memory structure comprises a floating gate. The memory structure may comprise an ETOX structure (that is, a 1T structure), a 1.5T structure (a split gate structure), a 2T structure, or an EEPROM structure, which are not illustrated or listed in the figure. For example, the ETOX structure is used as an example in the present disclosure. As shown in FIG. 2, a classic ETOX structure comprises a bulk region 1, a source region 2 and a drain region 3 that are formed in the bulk region 1, and a tunnel oxide layer 4, a floating gate 5, a dielectric oxide layer 6, and a control gate 7 that are sequentially formed on the bulk region 1. In one embodiment, the bulk region 1 is a P-type bulk, and the source region 2 and the drain region 3 are N-type doped regions.

It should be noted that, any memory structure with a floating gate is applicable to the method for programming a memory of the present disclosure, and is not limited to the ETOX structure mentioned herein.

Figure 3:
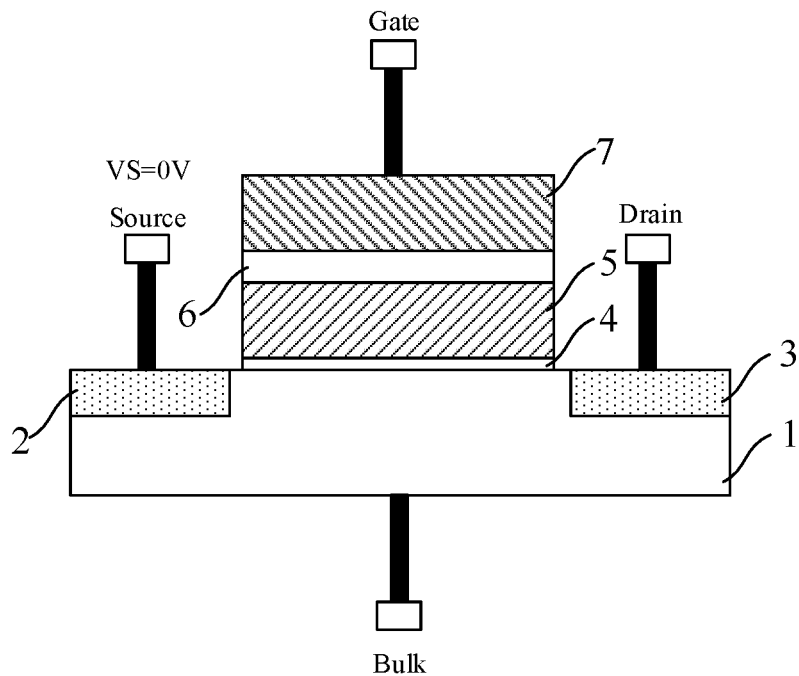
FIG. 3 is a schematic diagram of an operation of floating a source in a method for programming a memory according to the present disclosure.

Specifically, as shown in FIG. 3, the source of the memory structure is grounded, in which case the voltage VS at the source is 0 V.

Figure 4:
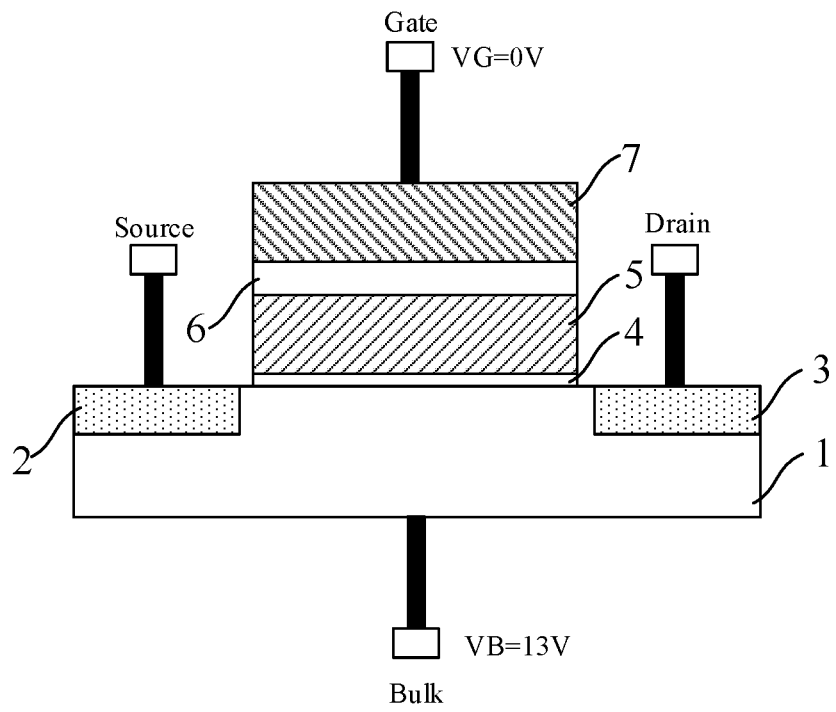
FIG. 4 is a schematic diagram of an operation of pre-erasing in a method for programming a memory of the present disclosure.

In one embodiment of the present disclosure, before step 1), the method further comprises: pre-erasing the memory structure to remove residual charges in the floating gate 5. Charges accumulate in the floating gate 5 due to factors such as the manufacturing process or environmental electrostatic. Therefore, pre-erasing may be performed before step 1), to eliminate the impact of residual charges on subsequent operations. Specifically, as shown in FIG. 4, voltages are applied to the gate and the bulk of the memory structure respectively. The voltage VB applied to the bulk is higher than the voltage VG applied to the gate. For example, the difference between the voltage applied to the gate and the voltage applied to the bulk is not less than 10 V. Optionally, the voltage VB applied to the bulk is set to 13 V, and the voltage VG applied to the gate is set to 0 V. In actual application, the values of VB and VG and their difference may be set as needed. For example, VB=10 V, VG=−5 V; or VB=15 V, VG=−1 V, as long as the residual charges in the floating gate 5 can be removed to avoid affecting subsequent operations.

It should be noted that, while ensuring that the residual charges in the floating gate 5 do not affect the subsequent operations, the pre-erasing step may be eliminated. In addition, any method that can implement pre-erasing is only applicable to the present disclosure, which is not limited to this embodiment.

2) Form an electric field between a drain and a bulk of the memory structure, generate electron-hole pairs, and generate primary electrons, wherein the voltage applied to the bulk is lower than the voltage applied to the drain, and the difference between the voltage applied to the drain and the voltage applied to the bulk is not less than 10 V.

Figure 5:
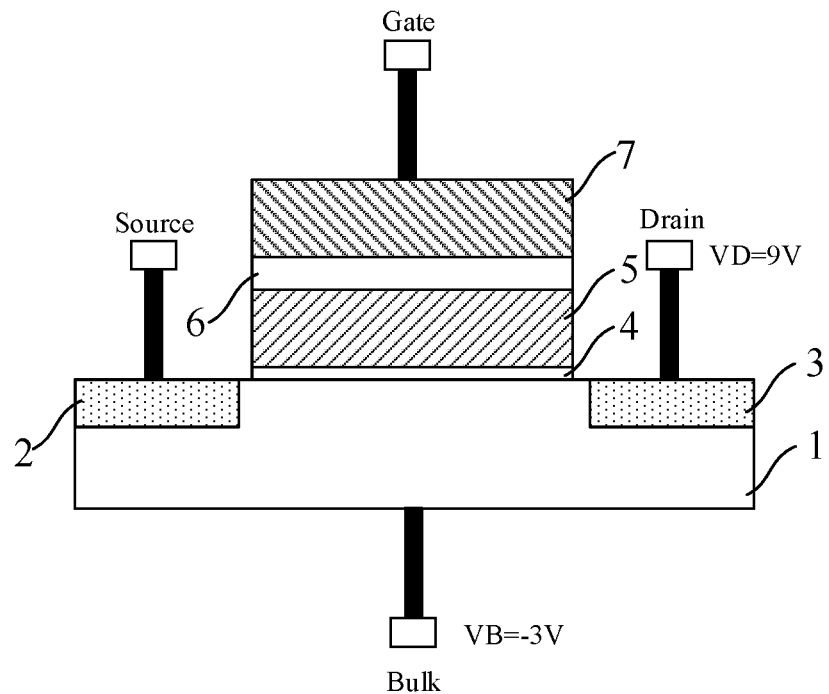
FIG. 5 is a schematic diagram of an operation of generating primary electrons in a method for programming a memory of the present disclosure.

Specifically, as shown in FIG. 5, a voltage VD is applied to the drain of the memory structure, and a voltage VB is applied to the bulk of the memory structure. There is a voltage difference between the drain and the bulk of the memory structure, and thus an electric field can be formed. For example, the difference between the voltage applied to the drain and the voltage applied to the bulk is not less than 4 V (comprising, but not limited to, 4.5 V, 5 V, 5.5 V, 7 V, 8 V, and 12 V). Optionally, the voltage VB applied to the bulk is set to −3 V, and the voltage VD applied to the drain is set to 9 V. In actual application, the values of VB and VD and their difference may be set as needed; for example, VB=−2 V, VD=4.5 V; or VB=0 V, VD=6 V, as long as a strong electric field can be resulted to obtain electron-hole pairs.

3) Make holes accelerate downward under the action of the electric field and collide with the bulk in the memory structure within a predetermined time to further generate secondary electrons.

Specifically, for example, the predetermined time is set to 10 ns to 100 ns. In actual use, the predetermined time may be adjusted based on factors such as electric field strength, as long as the secondary electrons required in the present disclosure can be generated, which is not limited to this embodiment.

Specifically, within the predetermined time, heavily accelerated holes collide with the bulk, and generate relatively light electrons, that is, the secondary electrons.

4) Apply voltages to the gate and the bulk of the memory structure respectively, wherein the voltage applied to the bulk is lower than the voltage applied to the gate, to enable the secondary electrons to generate tertiary electrons under the action of an electric field in a vertical direction, and the tertiary electrons are injected into the floating gate 5 of the memory structure to complete a programming operation.

Figure 6:
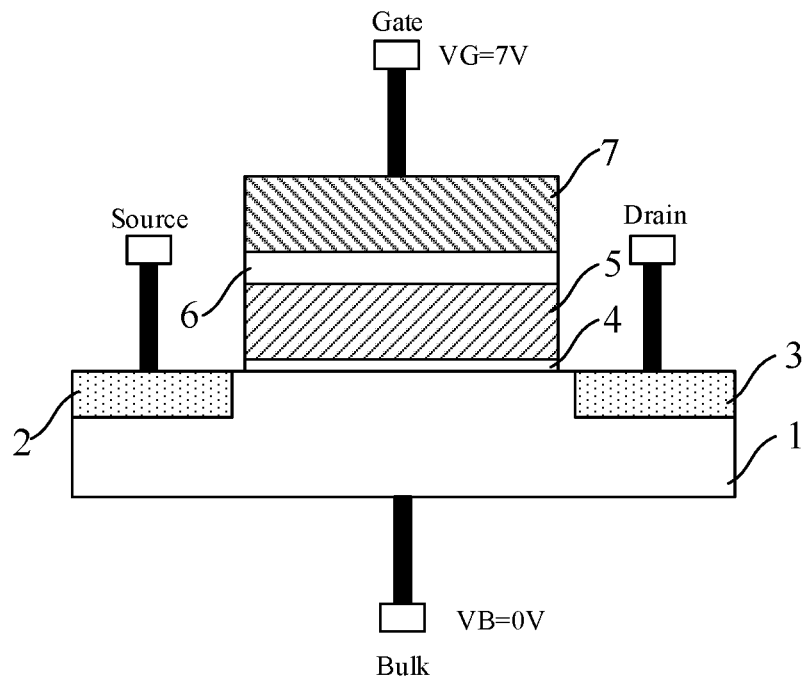
FIG. 6 is a schematic diagram illustrating the operation where tertiary electrons enter a floating gate in a method for programming a memory of the present disclosure.

Specifically, as shown in FIG. 6, a voltage VG is applied to the gate of the memory structure, and a voltage VB is applied to the bulk of the memory structure. There is a voltage difference between the gate and the bulk of the memory structure, and thus an electric field in the vertical direction can be formed. For example, the difference between the voltage applied to the gate and the voltage applied to the bulk is not less than 7 V. Optionally, the voltage VB applied to the bulk is set to 0 V, and the voltage VG applied to the gate is set to 7 V. In actual application, the values of VB and VG and their difference may be set as needed; for example, VB=0 V, VG=6 V, as long as the electrons can obtain sufficient kinetic energy to overcome a Si-Oxide energy barrier and enter the floating gate 5 through the tunnel oxide layer 4.

Figure 7:
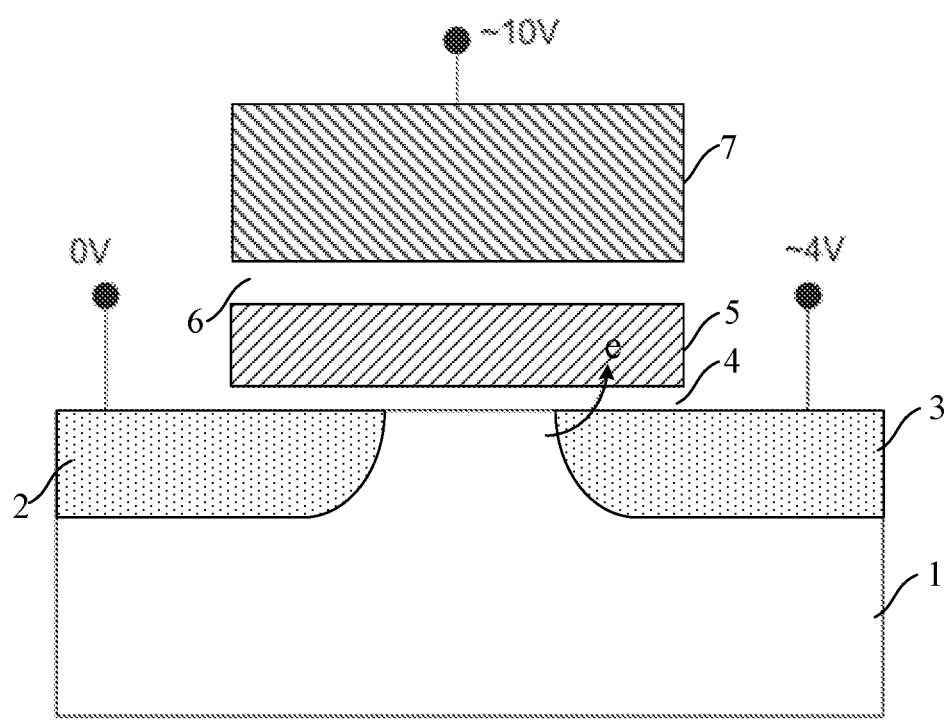
FIG. 7 is a schematic diagram of a programming principle of an existing ETOX structure.

As shown in FIG. 7, an existing ETOX structure is programmed via HCI. Charges are stored in the floating gate, and the voltage is applied to the control gate. During programming, a voltage is applied to the drain to generate hot electrons e, a voltage is applied to the gate and coupled to the floating gate through the dielectric oxide layer to generate an electric potential, to assist the electrons in overcoming the energy barrier before being injected into the floating gate through the tunnel oxide and completing the programming. There are problems such as low programming efficiency, high power consumption of flash memory devices, and body penetration effects in this type of structure.

In the method for programming a memory of the present disclosure, a lateral electric field is first generated, then electron-hole pairs are generated, and primary electrons are generated and move to a drain. The primary electrons then collide with a side wall of a drain region to make the holes accelerate downward and collide with a bulk to generate secondary electrons. A voltage is finally applied to a gate to cause the secondary electrons to generate tertiary electrons under the action of a vertical electric field, and the tertiary electrons are injected into a floating gate to complete a programming operation. The method for programming a memory of the present disclosure is based on the tertiary electron collision principle, where lateral and vertical electric fields are simultaneously formed. Programming is performed by excitation of tertiary electrons, where the tertiary electrons enter the floating gate in the vertical electric field in a vertical manner, so that the programming efficiency can be improved and the power consumption reduced, the read current for programming is relatively high, and the damage to the tunnel oxide layer is slight.

In summary, the present disclosure provides a method for programming a memory, comprising: providing a memory structure with a floating gate, and grounding a source of the memory structure; forming an electric field between a drain and a bulk of the memory structure, generating electron-hole pairs, and forming primary electrons, wherein a voltage applied to the bulk is lower than a voltage applied to the drain; making holes accelerate downward under the action of the electric field and collide with the bulk in the memory structure within a predetermined time to generate secondary electrons; and forming a vertical electric field between a gate and the bulk of the memory structure, wherein a voltage applied to the bulk is lower than a voltage applied to the gate, to enable the secondary electrons to further collide with the electron-hole pairs under the action of the vertical electric field to generate tertiary electrons, and the secondary electrons and the tertiary electrons are superimposed and injected into the floating gate of the memory structure to complete a programming operation. According to the method for programming a memory of the present disclosure, a programming voltage operation manner is improved and optimized, to trigger tertiary electron excitation to perform programming, so that programming efficiency can be improved, power consumption can be reduced, the read current for programming is high, and the tunnel oxide layer is only subject to minor damage. Therefore, the present disclosure effectively overcomes various disadvantages in the prior art, and has a high industrial value.

The foregoing embodiments merely exemplify the principles and effects of the present disclosure, but are not intended to limit the present disclosure. Any person skilled in the art may make modifications or changes on the foregoing embodiments without departing from the spirit and scope of the present disclosure. Therefore, all equivalent modifications or changes made by a person of ordinary skill in the art without departing from the spirit and technical idea of the present disclosure shall be covered by the claims of the present disclosure.

What is claimed is:
1. A method for programming a memory, comprising at least:
   1) providing a memory structure with a floating gate, and grounding a source of the memory structure;
   2) forming an electric field between a drain and a bulk of the memory structure by applying voltages to the drain and the bulk, generating electron-hole pairs, and generating primary electrons, wherein the voltage applied to the bulk is lower than the voltage applied to the drain;
   3) making holes accelerate downward under the action of the electric field and collide with the bulk in the memory structure within a predetermined time to generate secondary electrons; and
   4) forming a vertical electric field between a gate and the bulk of the memory structure by applying voltages to the gate and the bulk, wherein the voltage applied to the bulk is lower than the voltage applied to the gate, to enable the secondary electrons to further collide with the electron-hole pairs under the action of the vertical electric field to generate tertiary electrons, and the secondary electrons and the tertiary electrons are superimposed and injected into the floating gate of the memory structure to complete a programming operation.

2. The method for programming a memory as in claim 1, wherein the memory structure comprises an ETOX structure, a 1.5T structure, a 2T structure, or an EEPROM structure.

3. The method for programming a memory as in claim 1, wherein in step 2), the difference between the voltage applied to the drain and the voltage applied to the bulk is not less than 4 V.

4. The method for programming a memory as in claim 1, wherein in step 3), the predetermined time is between 10 ns and 100 ns.

5. The method for programming a memory as in claim 1, wherein in step 4), the difference between the voltage applied to the gate and the voltage applied to the bulk is not less than 7 V.

6. The method for programming a memory as in claim 1, wherein before step 1), the method further comprises a step of pre-erasing the memory structure to remove residual charges in the floating gate.

7. The method for programming a memory as in claim 6, wherein a method of the pre-erasing comprises: applying voltages to the gate and the bulk of the memory structure respectively, wherein the voltage applied to the bulk is higher than the voltage applied to the gate.

8. The method for programming a memory as in claim 7, wherein the difference between the voltage applied to the gate and the voltage applied to the bulk is not less than 10 V.

\* \* \* \* \*